United States Patent [19]
Boire et al.

[11] Patent Number: 5,618,579
[45] Date of Patent: Apr. 8, 1997

[54] PROCESS FOR THE VAPOR DEPOSITION OF A METAL NITRIDE-BASED LAYER ON A TRANSPARENT SUBSTRATE

[75] Inventors: Philippe Boire, Paris; Bertrand Testulat, Sarcelles, both of France

[73] Assignee: Saint-Gobain Vitrage, Courbevoie, France

[21] Appl. No.: 288,801

[22] Filed: Aug. 12, 1994

[30] Foreign Application Priority Data

Aug. 12, 1993 [FR] France .................................. 93 09916

[51] Int. Cl.$^6$ ....................................... B05D 5/06
[52] U.S. Cl. ..................... 427/166; 427/255; 427/255.2; 427/314; 427/164; 65/443
[58] Field of Search .................. 427/248.1, 255, 427/255.1, 255.3, 586, 164, 255.2, 166, 314; 65/443

[56] References Cited

U.S. PATENT DOCUMENTS

| | | | |
|---|---|---|---|
| 3,615,271 | 10/1971 | Dietz | 23/359 |
| 5,087,593 | 2/1992 | Narula | 427/419.7 |
| 5,139,825 | 8/1992 | Gordon et al. | 427/255.2 |
| 5,227,334 | 7/1993 | Sandhu | 437/192 |
| 5,330,793 | 7/1994 | Winter et al. | 427/248.1 |

FOREIGN PATENT DOCUMENTS

| | | |
|---|---|---|
| 0425825 | 5/1991 | European Pat. Off. . |
| 0546670 | 6/1993 | European Pat. Off. . |
| 62-070208 | 3/1987 | Japan . |
| WO-A-9009883 | 9/1990 | WIPO . |

OTHER PUBLICATIONS

Webster's II New Riverside University Dictionary p. 533 1984. (no mo.).

Primary Examiner—Janyce Bell
Attorney, Agent, or Firm—Oblon, Spivak, McClelland, Maier & Neustadt, P.C.

[57] ABSTRACT

A metal nitride or oxynitride layer is pyrolytically deposited onto a transparent substrate by a process consisting of simultaneously bringing into contact at least one metal precursor and at least one amine as a nitrogen precursor into contact with said substrate which is heated for a high temperature.

27 Claims, No Drawings

PROCESS FOR THE VAPOR DEPOSITION OF A METAL NITRIDE-BASED LAYER ON A TRANSPARENT SUBSTRATE

BACKGROUND OF THE INVENTION

1. Field of the Invention

The invention relates to the deposition of a metal nitride-based layer on a transparent, and in particular, glass substrate with a view to producing glazings having protective properties with respect to solar radiation.

2. Discussion of the Background

Because the presence of nitride, such as titanium nitride layers on a glazing, such glazings make it possible to reduce in a room or cockpit the heat supply resulting from solar radiation by absorbing and reflecting the radiation.

Different methods exist for depositing metal nitride layers vacuum deposition include cathodic sputtering which is assisted by a magnetic field. This technique gives good results and makes it possible to obtain nitride layers having a perfectly controllable composition and a satisfactory colorimetry, with in particular, a grey color in transmission. Vacuum deposition can only be used discontinuously and requires complex equipment leading to a high production cost.

Pyrolytic methods and in particular, chemical vapor deposition (CVD) methods can also be used. These methods consist of contacting a substrate, which is raised to a high temperature, with metal and nitrogen precursors which, when heated, decompose to nitrides when contacted with the substrate.

These methods have the advantage of being usable in a continuous manner directly on a float glass ribbon, particularly in a float bath enclosure where the glass is already at an adequate pyrolytic temperature, without having to use constraining operating conditions, e.g. with regards to the pressure.

Thus, EP-B-128 169 describes the preparation of titanium nitride layers by vapor phase pyrolysis from a titanium precursor in the form of titanium tetrachloride and a nitrogen precursor in the form of ammonia. However, the described process imposes a strict control of the temperature conditions under which deposition takes place, so as to avoid, when the two precursors come into contact, the formation of a secondary reaction product in pulverulent form giving rise to a dirtying of the distribution device and possibly a reduction in the quality of the nitride film obtained by the formation of pits or milkiness on its surface.

It has also been found that the use of these two precursors without using strictly monitored operating conditions, particularly with regards to traces of impurities, moisture or oxidizing compounds of the oxygen type in the distribution equipment or when the temperature is not high enough lead to nitride layers which give the substrate (glass substrate type) which they cover a yellow-brown coloring in transmission and not the grey coloring which is e.g. obtained when using cathodic sputtering deposition methods. This color change results from the fact that the nitride layer differs slightly from the structural standpoint, chemically and/or electronically, more particularly, because of a certain content of impurities or elements other than the nitrogen or metal in question. However, this yellow or brown color is not particularly popular with building architects, because it gives a significant discoloration to the color of the sky which can be seen by a person within a room equipped with such a substrate as a glazing.

It is also known from U.S. Pat. No. 5,194,642 to use, for the deposition of a titanium nitride layer on a glass substrate, a single metal organic precursor containing both the necessary titanium and nitrogen atoms. This product, which is in pulverulent form, is the result of a reaction between a titanium halide and an amine, which takes place in two stages, the first at a relatively low temperature and under atmospheric pressure and the second under a partial vacuum at a much higher temperature. It is probable that the yield of such a reaction is not very high and it is also necessary to employ an additional stage of sublimating the precursor before spraying it onto the glass substrate. Thus, from the overall standpoint, the use of such a precursor tends to reduce the efficiency of the pyrolysis compared with the two starting constituents, makes the deposition process more complicated, and increases costs. A need therefore continues to exist for an improved method of providing a transparent substrate with a nitride layer of acceptable color.

SUMMARY OF THE INVENTION

Accordingly, one object of the invention is to provide a process for the vapor phase deposition of a metal nitride layer, which combines a good yield, ease of use on the industrial scale and favorable colorimetry of the layers obtained, particularly in transmission.

Briefly, this object and other objects of the present invention as hereinafter will become more readily apparent can be attained in a method of pyrolytically depositing a metal nitride or oxynitride, in particular a titanium nitride or oxynitride-based layer on a transparent, in particular glass substrate, by simultaneously bringing into contact with said substrate raised to a high temperature at least one metal precursor and at least one amine nitrogen precursor. The term precursors is understood to mean compounds able to decompose on combining at high temperatures.

DETAILED DESCRIPTION OF THE PREFERRED EMBODIMENTS

This process is particularly suitable for the deposition of metal nitride layers on a float glass ribbon in a continuous manner, particularly within the float bath enclosure.

The choice of a nitrogen precursor, as an amine, makes it possible to prepare nitride layers, which impart to their transparent carrying substrate, a color in transmission in the blue range, which is at present highly appreciated by architects, particularly in the building sector. What is remarkable in the process according to the invention is that in order to achieve this color effect, there is no requirement to adopt very strict operating conditions, which would be difficult and expensive to achieve on an industrial scale, e.g. on a float line.

The reason why the color in transmission of the supporting substrate is favorably modified when using an amine and not ammonia as the nitrogen precursor, under identical operating conditions, is probably due to a modification of the reaction mechanisms when the nitrogen precursor and the metal precursor come into contact at high temperature. The mechanisms are complex and have not yet been completely explained, but it would appear that the use of amine as the nitrogen precursor changes the breaking diagram of the chemical bonds within the metal precursor.

The choice of the nitrogen precursor according to the invention will have a certain effect on the structure and/or quantity of minor constituents, other than the metal and nitrogen, in the metal nitride layer obtained and can to a certain extent modify the properties and characteristics thereof. Thus, it has been found that the formation of titanium nitride from titanium tetrachloride $TiCl_4$ and an amine of the methylamine type in place of ammonia leads to a significant increase in the residual chlorine quantity in the nitride layer and modifies its electrical behavior, particularly by increasing its conductivity, and also its optical properties.

In addition, an amine precursor has a smaller tendency than ammonia to form a pulverulent secondary product with the metal precursor, which is advantageous, because this makes it possible to reduce the frequency with which the gas supply means are cleaned and to maintain the quality of the layer obtained, without reducing the yield of the process.

The preferred embodiment of the invention consists of performing deposition with the aid of a single distribution nozzle in order to supply the two precursors in independent manner and without premixing, so that they only come into contact on leaving the nozzle and in the vicinity of the substrate. It has been found that the yield and quality of the layer are improved as a result of this.

With regards to the choice of metal precursors, within the scope of the invention, preference is given to the use of halides and in particular chlorides of the titanium tetrachloride ($TiCl_4$) type.

With regards to the nitrogen precursor, the most suitable amines for a reaction by pyrolysis are in particular primary amines and, to a lesser degree, secondary amines having alkyl radicals, in particular, of one to four carbon atoms. Suitable amines include methyl amine $(CH_3)NH_2$, ethyl amine $(C_2H_3)NH_2$, dimethyl amine $(CH_3)_2NH$, tert-butyl amine $(C_4H_3)NH_2$ and any mixture of at least two of these amines. Methyl amine is particularly preferred, because it has a limited steric hindrance, which would appear to favor a better reaction on the surface of the substrate, a better anchoring leading to durable layers of good quality (especially excellent uniformity of the thickness and a lack of haziness in appearance) and with a good material yield. Moreover, the fact that it only contains little carbon reduces any risk of fouling the distribution nozzle by carbon deposits. However, the other amines are also of interest, however, under slightly different deposition conditions.

Thus, it would appear that the pyrolysis reaction involving the nitrogen precursor is improved and accelerated when said precursor contains N—C bonds, which exhibit the effect of breaking easily when heated, taking into account that carbon radicals should however not increase to avoid steric hindrance of the molecule, which explains why primary amines, which have N—H bonds, are of interest. It has also been found that the use of amines carrying such carbon radicals has not led to the presence of detectable carbon traces in the nitride layer, which might have been feared in view of the fact that carbon tends to lower the electrical performance characteristics of nitrides or deteriorate the color thereof.

The process according to the invention also makes it possible to change the color transmitted by the supporting substrates, as a function of need. Thus, the nitrogen precursor or precursors can all be in amine form, so as to guarantee a blue color in transmission. Another possibility consists of combining with said amine precursor or precursors other nitrogen precursors and more particularly ammonia. By modifying the relative proportion between the amine or amines and the ammonia, it is thus possible to obtain all color shades in transmission between yellow and blue, passing through green. Thus, it is possible to combine in modifiable relative proportions methyl amine and ammonia.

Fewer problems are caused by the combination of two nitrogen precursors if the operating conditions are the same for amine or ammonia introduction.

Preferably, the pyrolytic process of the invention takes place on a substrate heated to approximately 400° to 700° C., notably more than 500° C. and advantageously between 500° and 680° C., namely the temperatures encountered in the downstream part of the float enclosure, or between the float enclosure and the annealing lehr.

It has proved effective to operate with a considerable nitrogen precursor excess compared with the metal precursors, but it is possible to employ any relative proportion of the two precursors.

The process according to the invention is more particularly applicable to the production of multiple glazings of the double glazing type, so as to reduce energy transmission resulting from solar radiation in the rooms which they equip.

The titanium nitride or oxynitride layers, because of the choice of the precursors according to the invention, consequently contain a detectable, residual chlorine content and in particular in an atomic amount of 0.1 to 15%, more especially 0.5 to 11%, for instance of 5±2%, compared to other elements. It would appear that this chlorine content regulates the color of transmission of the substrate from yellow-brown toward the blues.

The amount of chlorine can be controlled by selecting the deposition conditions of the temperature, but also by modifying the relative amounts of ammonia and amine, when it is decided to combine them.

It is thus possible to produce the layer without adopting draconian conditions with respect to the deposition atmosphere, without any fear of obtaining not very aesthetic transmitted color, chlorine acting to some extent as a "color corrector" if the layer contains "impurities" which would in themselves be able to unfavorably modify the color transmitted.

Thus, if the layer is continuously deposited on a glass ribbon of a float installation, either in the float enclosure, or downstream thereof, the deposition atmosphere has a tendency to contain varying amounts of oxygen and different humidity levels. It is also possible that the oxygen of the glass can migrate at its surface. There are several reasons of this type which can explain why the layer is deposited or is finally obtained in the form of an oxynitride, with an atomic oxygen amount ranging from 0.1 to 25%, particularly from 4 to 14%, based on the other elements of the layer.

As a function of the deposition conditions and in particular the more or less significant oxygen quantity in the layer, according to the invention it is advantageously possible to adjust the amount of chlorine necessary to ensure that the layer has a blue-tinged color during transmission.

Thus, the invention makes it possible to ensure that the substrate retains a highly reproducible blue-tinged color during transmission, no matter what the area in which the deposition takes place on the float line ribbon.

It should also be noted that the fact that the layer contains chlorine has no disadvantageous effect if, following the deposition of the layer, annealing of the glass substrate takes place in a neutral ($N_2$) or reducing ($N_2/H_2$) atmosphere. Thus, the chlorine remains in the layer and is not eliminated during the heat treatment, which elimination is a possibility which would have very probably led to the "return" of the yellow-brown transmission coloring. It must also be stressed that glazings incorporating these substrates with the layer have a good durability.

The titanium nitride and oxynitride layers deposited on the glass substrates to form glazings preferably have a thickness between 15 and 80 nanometers, particularly between 20 and 50 nanometers and e.g. approximately 25 to 30 nanometers, in order to adjust the transparency properties and reflection/absorption properties with respect to solar radiation.

A preferred embodiment of the inventions consists of placing on the nitride or oxynitride-based layer a dielectric material layer such as of silicon oxide, oxycarbide or oxynitride, having a geometrical thickness preferably between 10 and 150 nm, particularly between 40 and 80 nm, and a refractive index which is preferably between 1.5 and 1.9, notably between 1.6 and 1.8. The interest of such a top layer is firstly calorimetric, the color during transmission of the glazing essentially being dependent on the intrinsic characteristics of the functional absorbing layer constituted by the nitride or oxynitride layer.

However, a top layer having appropriate characteristics with regard to thickness and index makes it possible to adjust appearance upon reflection, particularly in agreeable colors of the blue type, without modifying or disturbing the color during transmission. In addition, if the chlorine and oxygen content of the nitride or oxynitride layer is not too high, this top layer makes it possible to carry out, on the glass substrate, heat treatments at high temperature and in an ambient, i.e. oxidizing atmosphere, of the bending or tempering type, without any deterioration to the nitride or oxynitride layer, which is effectively protected against oxidation by the top layer.

The covered substrate according to the invention can be incorporated into glazings of all types, such as multiple glazings, e.g. double glazings, which then have a color during transmission in the blues or blue-greens with a dominant wave-length during transmission between 475 and 520 nm. The double glazings then have light transmissions $T_L$ between e.g. 40 and 60% and an energy transmission $T_E$ between 35 and 55%. It is then possible to obtain selectivities, defined by the ratio $T_L/T_E$, higher than 1.1 and in particular approximately 1.20 to 1.45.

Having generally described this invention, a further understanding can be obtained by reference to certain specific examples which are provided herein for purposes of illustration only and are not intended to be limiting unless otherwise specified. The following examples relate to the deposition of titanium nitride layers with a thickness of approximately 25 to 30 nanometers using $TiCl_4$ as the titanium precursor on a soda-lime-silica glass substrate having a thickness of 6 mm.

Deposition takes place in the atmosphere of a float enclosure, namely a $H_2/N_2$ mixture at atmospheric pressure, by the simultaneous introduction, through a standard distribution nozzle, of the metal precursor and the nitrogen precursor onto the glass substrate.

The precursors are introduced into the nozzle under ambient pressure and temperature. Preferably the nozzle has two separate channels for each of the two precursors, which are only mixed on leaving the nozzle in the vicinity of the glass. In order to ensure that the decomposition reaction of the precursors only takes place on the glass surface and in order to avoid any deposition of nitride or carbon derivatives on the nozzle, it is preferable to provide, between the two aforementioned channels, a third channel generating an inert gas curtain of the $N_2$ type, which "separates" for one to a few millimeters the two precursor gases leaving the nozzle.

The vector gas of the two precursors is 95% $N_2$ and 5% $H_2$, approximately, by volume, the glass substrate travel speed being approximately 3 to 25 m/min and in particular 8 to 12 m/min, whilst the substrate temperature is approximately 500° to 700° C.

EXAMPLES 1 AND 2

These are comparative examples, the nitrogen precursor being ammonia in a considerable excess, in an amount of 1 mole of ammonia for approximately $2 \cdot 10^{-2}$ mole of $TiCl_4$.

EXAMPLES 3 AND 4

These two examples are in accordance with the invention, the nitrogen precursor being methyl amine $CH_3NH_2$ in the same molar amount with respect to $TiCl_4$ as in Examples 1 and 2.

The following Table 1 shows, for each of the two examples, different characteristics of the thus covered substrates: the thicknesses of the layers in nanometers e, the light transmission $T_L$ and energy transmission $T_E$ as a percentage, the values of the dominant wavelength in transmission lambda (t) in nanometers and the color purity values in transmission p (t) as a % (values measured in accordance with the illuminant $D_{65}$).

TABLE 1

|  | Example 1 | Example 2 | Example 3 | Example 4 |
| --- | --- | --- | --- | --- |
| e | 30 ± 5 | 25 ± 5 | 30 ± 5 | 25 ± 5 |
| $T_L$ | 50 | 58 | 50 | 54 |
| $T_E$ | 40 | 49 | 40 | 43 |
| Lambda (t) | 570 | 574 | 480–500 | 498 |
| p (t) | ~10 | 11 | 3–10 | 5 |

It should also be noted that the nitride layer of Example 3 is more conductive than that of Example 1 and in particular has a resistivity of approximately $2 \cdot 10^{-3}$ ohm/cm.

An electronic microprobe analysis was carried out on a layer obtained in accordance with example 1, but having a thickness of 100 nanometers and over a layer obtained according to example 2, but with a thickness of 92 nanometers, this type of analysis giving more reliable results on relatively large thicknesses.

It was found that in the layer obtained according to Example 1, the chlorine atomic percentage is approximately 2%, whilst it is approximately 11% in the layer obtained according to Example 2.

The analysis did not detect carbon in the two layers.

EXAMPLE 5 TO 7

These are three examples according to the invention, where the nitrogen precursor is constituted by a mixture of ammonia and methyl amine, with $TiCl_4$ as the titanium precursor, but in different molar proportions and in particular a molar proportion between the two nitrogen precursors between 25:75 and 75:25.

In Example 5, approximately 0.5 mole of NH, and 0.5 mole of $CH_3NH_2$ for $2 \cdot 10^{-2}$ mole of $TiCl_4$ are employed.

In Example 6, approximately 0.25 moles of $NH_3$ and 0.75 mole of $CH_3NH_2$ for $2 \cdot 10^{-2}$ mole of $TiCl_4$ are employed.

In Example 7, approximately 0.75 moles of $NH_3$ and 0.25 mole of $CH_3NH_2$ for $2 \cdot 10^{-2}$ mole of $TiCl_4$ are employed.

The deposited layers have a thickness of approximately $25\pm5$ nanometers. Much thicker layers were also formed in order to carry out reliable electronic microprobe analyses. For each of the examples the following Table 2 gives the dominant transmitted wavelength lambda(t) in nanometers, the corresponding color purity p(t) as a % and the atomic amount of residual chlorine based on the other elements of the layer as a CL %.

TABLE 2

|  | Lambda (t) | p (t) | % CL |
|---|---|---|---|
| Example 5 | 520 | 6 | 6 |
| Example 6 | 504 | 5 | 8 |
| Example 7 | 550 | 6 | 4 |

The amount of atomic oxygen in these three layers is in a range 4 to 11%, which is relatively variable. Its quantification by analysis is not rendered very easy because of the important quantity of oxygen contained in the glass of the substrate. It is low if the deposition takes place in the float bath enclosure and will be higher if deposition takes place outside the enclosure. A modification of the amount of chlorine makes it possible to compensate for oxygen quantity variations in order to keep constant the calorimetric appearance in transmission of the substrate.

EXAMPLES 8 TO 11

On covered substrates according to example 4 is deposited in known manner a $SiO_2/SiO_xC_y$ top layer, using a vapor phase pyrolytic method based on silane and ethylene. For further details reference should be made to EP-A-518 755.

For these four examples, the top layers all have a refractive index of approximately 1.7, but variable geometrical thicknesses. Once the substrates are covered with the two layers, they are installed in double glazing form by combining them with another approximately 6 mm thick sodalime-silica glass substrate, the thin layers preferably being on face 2 once the double glazing is installed in a building (the faces of a multiple glazing are conventionally numbered from the outermost face with respect to the building).

For each of the four double glazings, Table 3 gives the thickness values in nanometers of the $SiO_xC_y e(SiO_xC_y)$ top layers, the values of $T_L$, $T_E$, lambda (t) and p(t) with the same meanings as hereinbefore, as well as the solar factor (FS), which is the ratio between the total energy entering the room through the glazing and the incident solar energy and which is measured in accordance with ISO standard 9050.

TABLE 3

|  | $e(SiO_xC_y)$ | FS | $T_E$ | $T_L$ | Lambda (t) | p(t) |
|---|---|---|---|---|---|---|
| Example 8 | $50 \pm 2$ | 0.44 | 37 | 51 | 499 | 3 |
| Example 9 | $53 \pm 2$ | 0.44 | 37 | 51 | 492 | 4 |
| Example 10 | $51 \pm 2$ | 0.44 | 37 | 50 | 493 | 3 |
| Example 11 | $60 \pm 2$ | 0.46 | 39 | 52 | 486 | 7 |

Table 4 gives for each of the double glazings the values linked with the appearance in external reflection of the glazings, with the external light reflection $R_{L\ ext}$ as a %, the dominant wavelength lambda $(R_{ext})$ and the purity $p(R_{ext})$ associated therewith, together with the values linked with the appearance in internal reflection with the internal light reflection $R_{L\ int}$ and the dominant wavelength values lambda $(R_{int})$ and purity values $p(R_{int})$ associated therewith.

The appearance in external reflection corresponds to that observed by a person looking at the glazing installed in a facade from the outside. The appearance in internal reflection corresponds to that observed by a person looking at the glazing from the inside of the room, when it is dark outside and the room has illuminating means.

TABLE 4

|  | $R_{Lext}$ | Lambda $(R_{ext})$ | $pR_{ext}$ | $R_{Lint}$ | Lambda $R_{int}$ | $p(R_{int})$ |
|---|---|---|---|---|---|---|
| Example 8 | 24 | 489 | 7 | 15 | 489 | 5 |
| Example 9 | 23 | 497 | 3 | 11 | 493 | 3 |
| Example 10 | 25 | 534 | 2 | 11 | 503 | 2 |
| Example 11 | 26 | 558 | 5 | 13 | 488 | 4 |

It is possible to draw the following conclusions from this information. The deposition of nitride layers from amine precursors makes it possible to obtain glazings which are blue during transmission, because according to Table 1 the dominant wavelength during transmission of the glazings of Examples 3 and 4 is in the range 475 to 500 nm, whilst the glazings of Examples 1 and 2 are obtained an the basis of ammonia retain a strong yellow coloring (dominant wavelength 570 to 575 nm).

Moreover, the blue color during transmission obtained according to the invention is associated with a low purity value p(t), in particular approximately 5%, which leads to an attenuated "whitewashed" shade of an aesthetic nature.

The process remains very simple, because the gaseous precursors are introduced into the nozzle at ambient pressure and temperature, without requiring a very precise control of the level of humidity, oxygen or residual impurities.

The absence of any premixing of the precursors in the nozzle is a favorable point, which greatly reduces the risk of pulverulent compounds forming prior to the deposition reaction.

With regard to the intrinsic characteristics of the nitride layers, those according to the invention have, according to microprobe analyses, a higher chlorine content than the layers obtained from ammonia, whose effect could not be foreseen. It is this higher chlorine content which makes it possible to obtain this highly aesthetic blue-tinged color during transmission, whilst avoiding the appearance of not very pleasant yellow colors because of the fact that the nitride layers deposited do not have an extreme purity and can also contain a little oxygen. However, there are no detectable carbon traces in the layers according to the invention, which is highly advantageous. The fact that these layers also have a higher electrical conductivity, at least when they are thicker than 50 nm means a higher quality and makes it possible to-obtain lower solar factor values when such a layer is fitted within an insulating glazing.

It is obvious that-it is possible to vary the thicknesses of the nitride layers in order to modify the light transmission values of the glazings carrying them, as a function of needs. However, this blue-tinged appearance in transmission is retained if the thickness of the layer is slightly modified (cf-Examples 3 and 4), which is very advantageous. However, the selectivity, i.e. the ratio $T_L/T_E$, remains roughly constant at approximately 1.20 to 1.45, so that the glazing retains good sun protecting characteristics, no matter what the requisite transparency level.

Examples 3, 4 and 8 to 11 make it clear that the color during transmission is largely inherent in the actual nitride or oxynitride layer. The addition of other thin non-absorbing layers, such as an oxide top layer, then makes it possible to retain this blue-tinged appearance during transmission, whilst adapting the appearance in reflection of the glazings. Thus, the dominant wavelength during transmission of glazings having a top layer according to Examples 8 to 11 remains in the range 475 to 500 nm. However, the appearance in external reflection, as a function of the top layer thickness, can vary as wished from the blue (Example 8) to the yellow-green (Example 11).

Examples 5 to 7 make it clear that if the proportion between the ammonia and the amine is modified, it is possible to vary the residual chlorine content, as well as the color during transmission, which approaches the yellow with a high ammonia proportion (Example 7) or the blue with a high amine proportion in Example 6. This, once again permits a controlled choice of appearance during transmission. It should also be noted that it is possible to regulate the residual chlorine content in other ways, whilst retaining a 100% nitrogen precursor in amine form, but by acting on the deposition conditions such as the temperature, and the like. (The quantity of chlorine incorporated in the layer tends to decrease when the pyrolysis temperature increases.)

In conclusion, the process according to the invention offers the possibility of controlling the color of the glazing, both upon light reflection and during transmission, and it is particularly easy to carry out. Thus, it makes it possible to "restore" to the metal nitride layer very satisfactory calorimetric characteristics using simpler and more economic deposition methods and conditions than those of the cathodic sputtering type.

Having now fully described the invention, it will be apparent to one of ordinary skill in the art that many changes and modifications can be made thereto without departing from the spirit or scope of the invention as set forth herein.

What is claimed as new and is desired to be secured by Letters Patent of the United States is:

1. A process for the vapor phase pyrolytic deposition of a metal nitride or oxynitride layer on a transparent substrate, comprising:

simultaneously bringing at least one metal precursor and a nitrogen precursor into contact with a surface of said substrate which is heated to an elevated temperature sufficient to pyrolytically decompose said precursors, thereby effecting decomposition of said precursors as said metal nitride or oxynitride layer, wherein said nitrogen precursor is a mixture of at least one amine and ammonia.

2. The process according to claim 1, wherein deposition occurs on a float glass ribbon substrate in a float bath enclosure.

3. The process according to claim 1, wherein deposition takes place with a single distribution nozzle in order to spray each precursor without mixing of the precursors within the nozzle, said precursors only coming into mixing contact upon leaving the nozzle near the surface of the substrate.

4. The process according to claim 1, wherein the layer is a titanium nitride or titanium oxynitride layer.

5. The process according to claim 4, wherein the metal precursor is a Ti halide.

6. The process according to claim 5, wherein the Ti halide is titanium tetrachloride.

7. The process according to claim 4, wherein the amine is a primary or secondary amine.

8. The process according to claim 7, wherein the amine is an amine containing $C_{1-4}$ alkyl group.

9. The process according to claim 7, wherein the amine is methyl amine $(CH_3)NH_2$, ethyl amine $(C_2H_5)NH_2$, dimethyl amine $(CH_3)_2NH$, tert-butyl amine $(C_4H_9)(NH_2)$ or a mixture of at least two of these.

10. The process of claim 4, wherein the titanium nitride or oxynitride layer has traces of chlorine in an atomic amount of 0.1 to 15%, based on the other elements of the layer.

11. The process of claim 10, wherein the amount of chlorine in said layer ranges from 0.5 to 11%.

12. The process according to claim 10, wherein the layer is an oxynitride containing traces of chlorine and oxygen in an atomic amount of 0.1 to 25%, based on the other elements of the layer.

13. The process of claim 12, wherein the amount of said oxygen ranges from 4 to 14%.

14. The process according to claim 10, wherein the geometrical thickness of the titanium nitride or oxynitride-based layer is between 15 and 80 nm.

15. The process of claim 14, wherein the layer has a thickness of between 20 and 50 nm.

16. The process according to claim 10, wherein the titanium nitride or oxynitride-based layer is covered by a dielectric material layer of silicon oxide, oxycarbide and/or oxynitride, having a geometrical thickness between 10 and 150 nm, and a refractive index between 1.5 and 1.9.

17. The process of claim 16, wherein the dielectric material layer has a thickness of 40 to 80 nm and the refractive index ranges from 1.5 to 1.9.

18. The process according to claim 1, wherein the nitrogen precursor comprises a mixture of amines.

19. The process according to claim 1, wherein the nitrogen precursor is a methylamine-ammonia mixture.

20. The process according to claim 1, wherein the substrate is heated to a temperature between 400° and 700° C.

21. The process according to claim 20, wherein the temperature ranges from about 500° to 680° C.

22. The process according to claim 1, wherein an excess amount of nitrogen precursor relative to the total amount of metal precursor or metal precursors is employed.

23. The process of claim 1, wherein said at least one amine is a primary amine.

24. The process of claim 1, wherein said substrate with said metal nitride or oxynitride layer reflects and absorbs solar radiation.

25. The process of claim 1, wherein said substrate with said metal nitride or oxynitride layer has a ratio $T_L/T_E$ above 1.1.

26. The process of claim 25, wherein said ratio ranges from 1.20 to 1.45.

27. A process for the vapor phase pyrolytic deposition of a metal nitride or oxynitride layer on a transparent substrate, comprising:

simultaneously bringing at least one metal precursor and at least one amine as a nitrogen precursor into contact with a surface of said substrate which is heated to an elevated temperature sufficient to pyrolytically decompose said precursors, thereby effecting deposition of said precursors as said metal nitride or oxynitride layer, wherein said substrate with said metal nitride or oxynitride layer has a color during transmission in the blues or blue-greens, with a dominant wavelength during light transmission between 475 and 520 nm, and the amine nitrogen precursor or precursors is combined with ammonia as a methylamine-ammonia mixture.

* * * * *